(12) United States Patent
Yoshii et al.

(10) Patent No.: US 6,286,499 B1
(45) Date of Patent: Sep. 11, 2001

(54) METHOD OF CUTTING AND SEPARATING A BENT BOARD INTO INDIVIDUAL SMALL DIVISIONS

(75) Inventors: Masahiro Yoshii; Shinichi Namioka, both of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/411,325

(22) Filed: Oct. 4, 1999

(30) Foreign Application Priority Data

Oct. 14, 1998 (JP) .................................................. 10-291999

(51) Int. Cl.$^7$ ........................................................ B28D 1/00
(52) U.S. Cl. .............................. 125/12; 125/901; 83/880; 83/886; 83/35; 83/36; 83/39
(58) Field of Search ..................................... 125/12, 13.01, 125/901; 83/880, 879, 886, 39, 35, 36

(56) References Cited

U.S. PATENT DOCUMENTS

| | | | | |
|---|---|---|---|---|
| 4,266,334 | * | 5/1981 | Edwards et al. | 29/583 |
| 4,572,757 | * | 2/1986 | Spadafora | 29/840 |
| 4,617,729 | * | 10/1986 | Celnik | 29/840 |
| 4,914,815 | * | 4/1990 | Takada et al. | 29/840 |

* cited by examiner

*Primary Examiner*—M. Rachuba
(74) *Attorney, Agent, or Firm*—Arent Fox Kintner Plotkin & Kahn, PLLC

(57) ABSTRACT

Disclosed is an improved method of cutting and separating a bent board into individual small divisions. Prior to the cutting and separating of the board into the individual chips the board is cut and separated into two or more pieces each large enough to have a reduced bend, compared with the bend of the board. Thus, each large division can be put and fixedly held on the chuck table of a cutting machine in stable condition, thus permitting the smooth, stable cutting of the large division into final small divisions.

6 Claims, 4 Drawing Sheets

METHOD OF CUTTING AND SEPARATING A BENT BOARD INTO INDIVIDUAL SMALL DIVISIONS

BACKGROUND OF THE INVENTION

1. Field of the Invention

The present invention relates to a method of cutting and separating a bent board into individual small divisions, and more particularly to an improvement in such cutting-and-separating method in reducing inaccurate separation which is caused by the bend of the board.

2. Related Arts

Referring to FIG. 9, a semiconductor wafer 30 is sucked and held on a chuck table 31, and the semiconductor wafer 30 can be diced into individual chips when a rotary blade 32 traverses the chuck table 31 in the X-axis direction.

Likewise, a chip size packages board (abbreviated as CSP board) 33 (see FIG. 10) can be cut and separated into individual pellets, i.e. CSPs, when the rotary blade 32 traverses the board along each cutting line 34 (broken line).

Such a CSP board 33 has a plurality of semiconductor chips arranged crosswise on a board material and hermetically attached thereto by resin such as glass epoxy resin (not shown the details), thus providing an integrated form as shown in FIG. 10. As seen from FIGS. 11 and 12, the board 33 has a significant bend. It was caused when the resin is exposed to a raised temperature at which the sealant is applied to a crosswise arrangement of chips, and when the sealant is set to provide a hermetically sealed object. Such a bent CSP board, when put on the chuck table 31 cannot be sucked thereon, thus preventing it from being fixedly held thereon. For this reason no smooth cutting is permitted.

Smooth and correct cutting cannot be permitted unless the board is held on the chuck board in stable condition.

SUMMARY OF THE INVENTION

One object of the present invention is to provide a bent board dicing method which permits the smooth, correct cutting of the board irrespective of its significant bending.

To attain this object a method of cutting and separating a bent board having a plurality of chips arranged thereon into individual small divisions with the aid of a cutting machine including at least a chuck table for holding a workpiece and means for cutting the workpiece held on the chuck table, is improved according to the present invention in that prior to the cutting and separating of the board into the individual chips the board is cut and separated into two or more pieces each large enough to have a reduced bend, compared with the bend of the board.

The board may be cut and separated into large divisions before it is held on the chuck table.

The board may be tentatively held on the chuck table to be cut and separated into large divisions.

The cutting-and-separating of the board into large divisions may be effected so incompletely that the divided board may be contiguous from division to division by the remaining board thickness.

The cutting-and-separating of the board into large divisions may be effected so completely that the divided board may be composed of separate large divisions.

The board may be lined with an adhesive tape, by which the board can be fixedly held on the chuck table.

The board may be directly put on and held by the chuck table.

The board may be a CSP board which comprises a plurality of semiconductor chips separated a predetermined space, arranged crosswise on a board material and hermetically sealed by resin, thus providing an integrated form.

Thanks to the dividing of the board into large divisions each having no significant bend the subsequent, final divisions into individual small pieces can be effected with precision; each large division can be positively sucked and held on the chuck table in stable condition.

Other objects and advantages of the present invention will be understood from the following description of preferred embodiments, which are illustrated in accompanying drawings.

DETAILED DESCRIPTION OF PREFERRED EMBODIMENT

Figure 1:
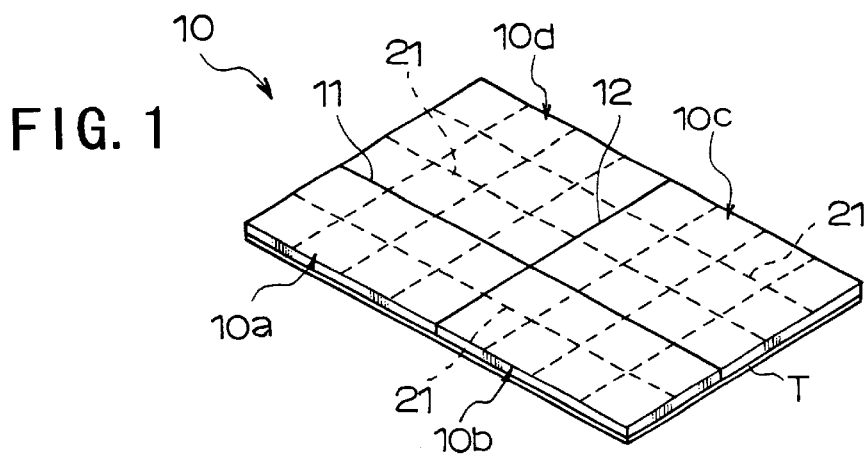
FIG. 1 is a perspective view of a CSP board lined with an adhesive tape, which board is to be diced into CSPs by the dicing method according to the present invention.
Figure 11:
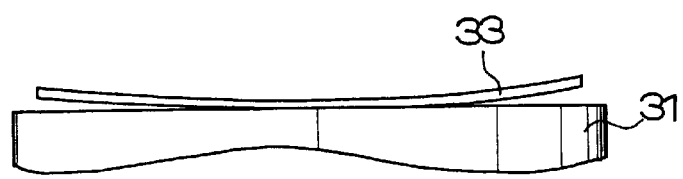
FIG. 11 illustrates how a bent CSP board is held on the chuck board.
Figure 12:
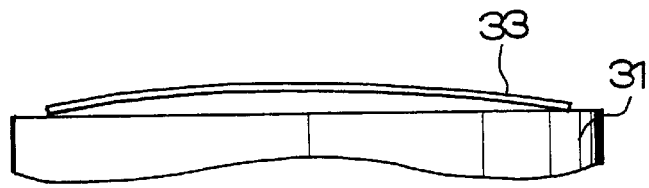
FIG. 12 illustrates how another bent CSP board is held on the chuck board.

The manner in which a CSP board 10 of FIG. 1 is cut and separated into individual pellets (CSPs) according to the present invention is described below. First, the CSP board 10 is cut along solid lines 11 and 12 to large divisions 10a, 10b, 10c and 10d, and then, each large division is cut along broken lines 20 to small divisions by using the cutting machine of FIG. 2. The CSP board 10 is somewhat bent as seen from FIGS. 11 and 12, in which the bending is shown exaggerated.

Figure 2:
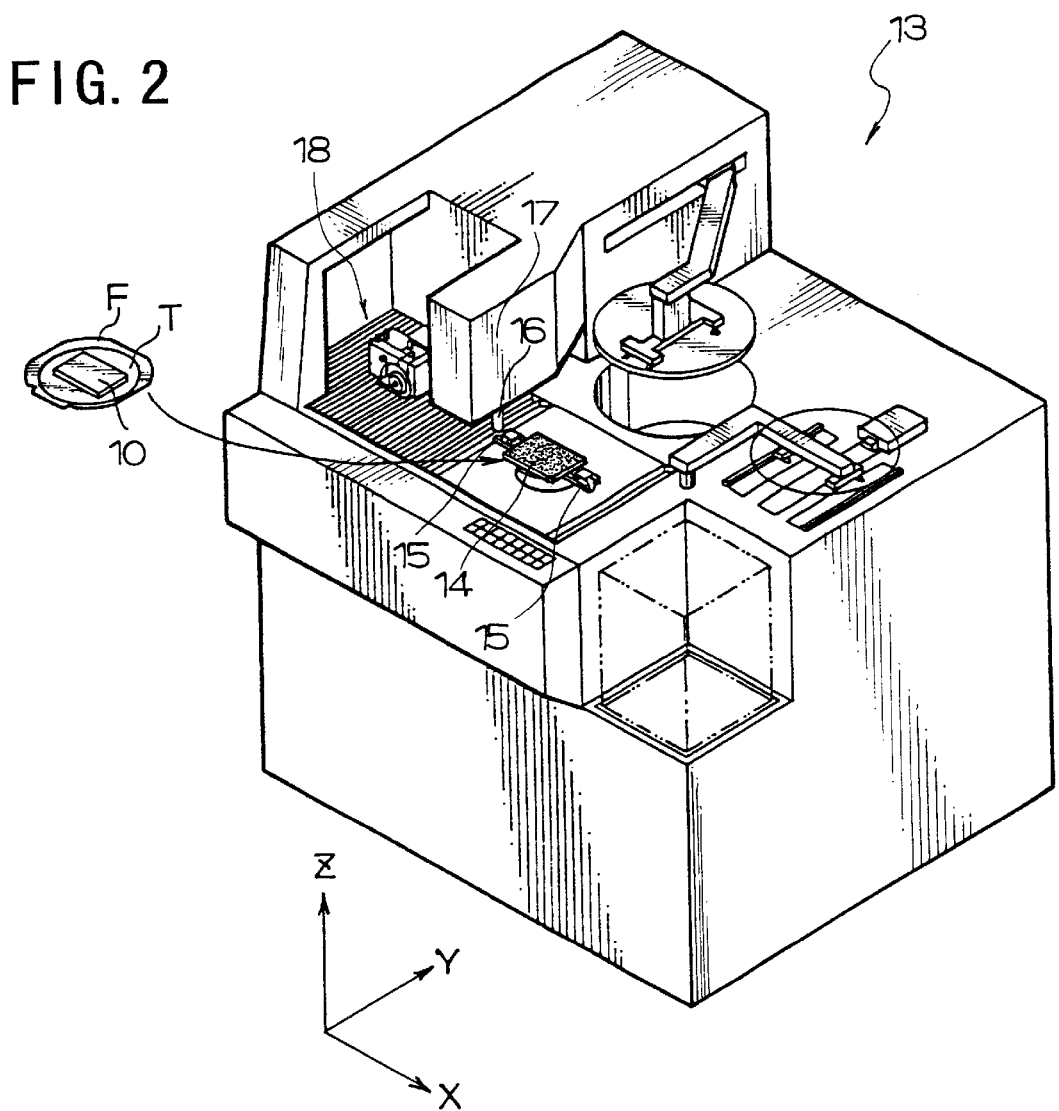
FIG. 2 is a perspective view of a cutting machine which can be used in dicing CSP board.

Division into large pieces may be effected by using the cutting machine 13 of FIG. 2 although other cutting machines may be used. The CSP board 10 may be put and fixedly held on the chuck table 14 of the cutting machine 13, provided that the bend of the CSP board 10 is so less in degree as to permit the negative pressure to be applied to the undersurface of the CSP board 10 for sucking and fixedly holding the same on the chuck table 14.

Even though the bend of the CSP board 10 is too large to prevent the sucking of the CSP board 10 to the chuck table 14, the CSP board 10 can be cut into large divisions, provided that the CSP board 10 is attached to the chuck table 14 with the aid of an adhesive tape T. Otherwise, the CSP board 10 may be cut into large divisions by using other appropriate devices. When using other devices, the board is cut and separated into large divisions before it is held on the chuck table.

When the CSP board 10 is cut into large divisions with the aid of the cutting machine 13 of FIG. 2, the CSP board 10 is put on the chuck table 14 directly or via an intervening adhesive tape T.

The chuck table 14 is driven in the X-axial direction to detect a selected large-division line 11 with the alignment means 17, and then, the chuck table 14 is driven in the X-axial direction to cut the CSP board 10 along the large-division line 11 with the cutting means 18.

After finishing the cutting the chuck table 14 is returned to its initial position where the chuck table 14 is rotated 90 degrees, and then, the chuck table 14 is driven again in the X-axial direction to cut the CSP board 10 along another crosswise large-division line 12 with the aid of the cutting means 18. Thus, the CSP board 10 is cut into four large pieces 10a, 10b, 10c and 10d.

The complete or incomplete cutting may be effected to meet occasional demands. In the complete cutting the CSP board is cut through its whole thickness whereas in the incomplete cutting the cut reaches short of the rear surface of the CSP board, thus leaving the remaining thickness of the CSP board.

Figure 3:
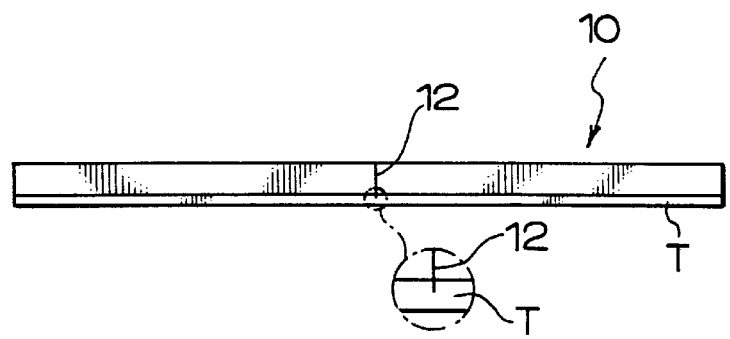
FIG. 3 is a front view of the CSP board lined with an adhesive tape, showing how the board is cut completely through its whole thickness to provide separate individual large divisions.

When a CSP board 10 lined with an adhesive tape T (see FIG. 1) is cut complete, the large divisions are connected together by the adhesive tape T, as seen from FIG. 3. When the cut reaches short of the rear surface of the CSP board 10 to leave the remaining thickness 19, the large divisions are connected together by the remaining thickness 19 of the CSP board 10. Whether the CSP board 10 lined with an adhesive tape T is cut completely or incompletely, all divisions remain contiguous, allowing them to be cut into small divisions without the necessity of removing the divided CSP board 10 from the chuck table 14.

Figure 5:
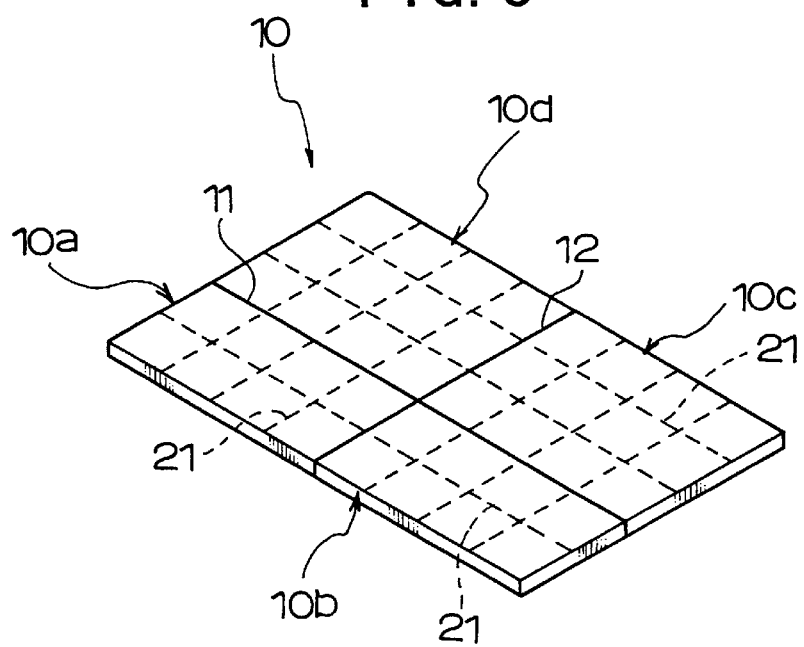
FIG. 5 is a perspective view of another CSP board having no adhesive tape lined therewith.
Figure 6:
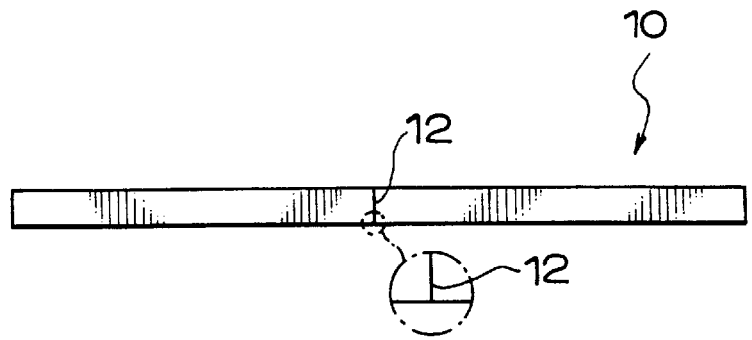
FIG. 6 is a front view of the lining-free CSP board, showing how the board is cut completely through its whole thickness to provide separate individual large divisions.

As for a lining-free CSP board as shown in FIG. 5, the CSP board is tentatively held on the chuck table 14 to be cut completely into separate large divisions (see FIG. 6), which are sucked and. fixedly held onto the chuck table 14 immediately. In this case, therefore, the separate large divisions can be cut into final small divisions without removing the large divisions from the chuck table 14 for replacement.

Figure 7:
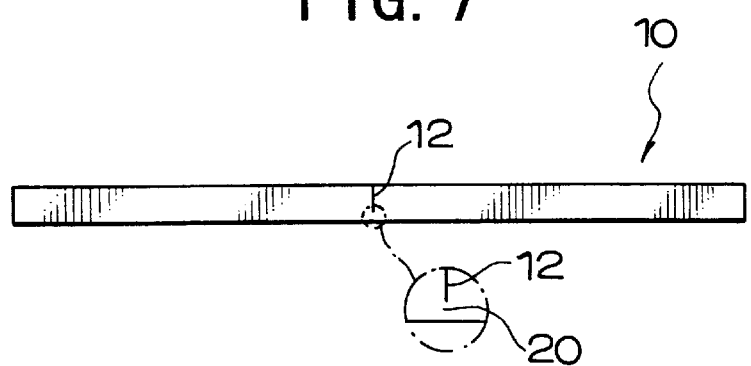
FIG. 7 is a similar front view of the lining-free CSP board, but showing that the cut is short of the rear surface of the board, permitting individual large divisions to be connected by the remaining thickness of the board.

In case of the incomplete cutting as seen from FIG. 7, leaving the remaining thickness of short distance 20 at each boundary: each large division of the CSP board 10 has no significant bend, allowing all large divisions to be closely put and sucked onto the chuck table 14. Then, each large division can be cut into final small divisions preferably by means of the rotary grinding blade 32.

Even if a lining-free CSP board 10 is cut completely, all large divisions can be sucked and fixedly held on the chuck table 14, causing no inconvenience in cutting each large division into small divisions.

If the CSP board 10 is cut completely, each large division, which is substantially flat, is closely put and sucked onto the chuck table 14 directly. It may be fixedly held via a carrier F, to which the large division is attached by an adhesive tape T. Then, the small division can be diced crosswise along the small-division lines 21 (see FIGS. 1 and 5).

Figure 4:
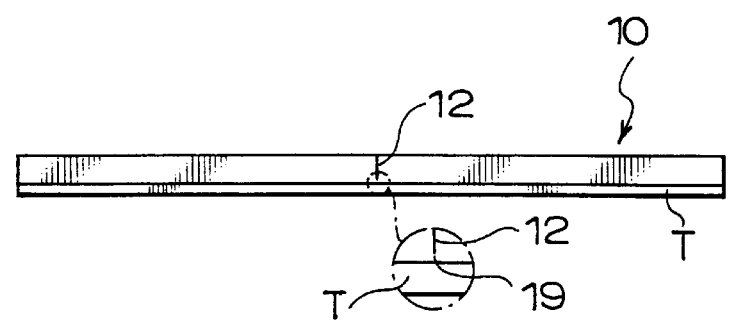
FIG. 4 is a similar front view of the CSP board, but showing that the cut is short of the rear surface of the board, permitting individual large divisions to be connected by the remaining thickness of the board.

If the CSP board is cut incompletely (see FIGS. 3, 4 and 7), all large divisions are connected, so that they are sucked onto the chuck table 14 as a whole.

The chuck table 14 is driven in the X-axial direction to detect a selected small-division line 21 with the alignment means 17, and then, the chuck table 14 is driven further in the X-axial direction to cut the CSP board 10 along the small-division line 21 with the cutting means 18.

Every time the cutting along the small-division line 21 has been finished, the cutting means 18 is shifted an inter distance between adjacent small-division lines in the Y-axial direction, so that the X-axial cutting along the small-division line 21 is repeated. Then, the chuck table 14 is returned to its initial position where the chuck table 14 is rotated 90 degrees, and then, the chuck table 14 is driven in the X-axial direction to cut the CSP board 10 along each crosswise small-division line 12 to provide individual pellets (CSPs). These CSPs are improved in quality compared with those which would be provided by dicing a bent CSP board held in unstable condition.

In this particular embodiment the CSP board 10 is cut in four large divisions. It, however, should be understood that the number of large-division lines depends on the degree of bend. Specifically the number of large-division lines should be so determined that each large division may be flat enough to assure that it may be laid on the chuck table in stable condition.

Figure 8:
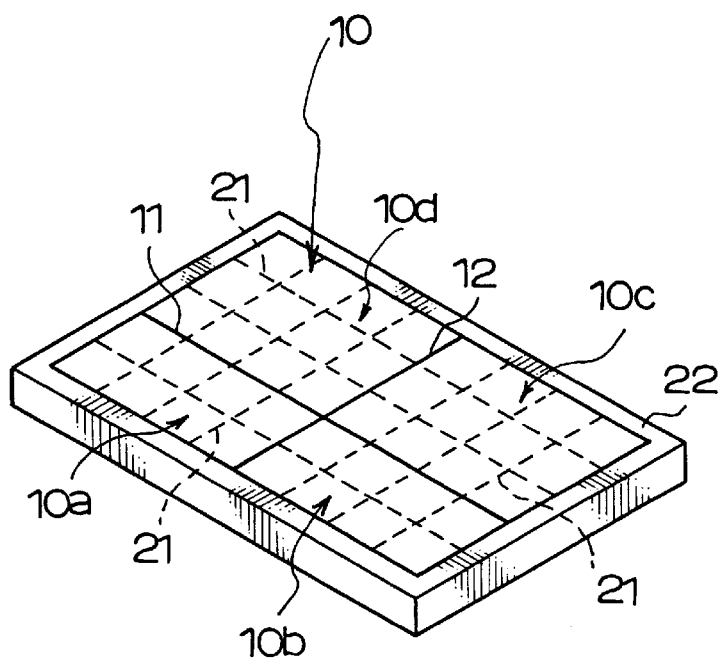
FIG. 8 is a perspective view of still another CSP board which is encapsulated.
Figure 9:
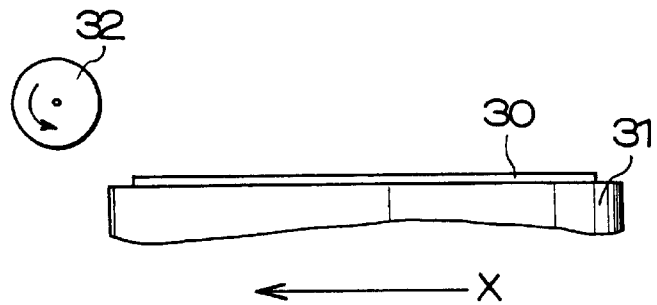
FIG. 9 illustrates how a CSP board can be cut on the chuck table by a rotary blade.
Figure 10:
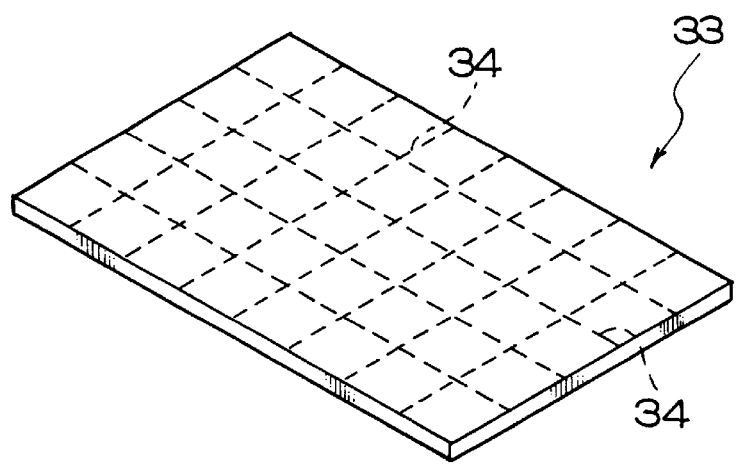
FIG. 10 is a perspective view of a CSP board.

The cutting method according to the present invention can be equally applied to an encapsulated CSP board 10 as shown in FIG. 8. In this case the capsule 22 is diced, too. The CSP board 10 is confined in the capsule 22, thereby preventing displacement of large divisions. The encapsulated CSP board, therefore, can be cut into large- and small-divisions without removing it from the chuck table 14.

The cutting method according to the present invention can be applied to any bent plate other than a CSP board.

What is claimed is:

1. A method of cutting and separating a bent board into individual small divisions with the aid of a cutting machine including at least a chuck table for holding a workpiece and means for cutting the workpiece held on the chuck table comprising the steps of:

cutting and separating the board into two or more large divisions each large division having a reduced bend, compared with the bend of the board, allowing said large division to be closely spaced and sucked onto the chuck table; and then cutting and separating the board into the individual small divisions.

2. The method according to claim 1, further comprising, prior to the step of cutting and separating, the step of providing a chip size packages board which comprises a crosswise arrangement of semiconductor chips leaving a predetermined space therebetween and hermetically sealed by resin, thus providing an integrated form as the bent board.

3. The method according to claim 2, further comprising lining the board with an adhesive tape, by which the board is fixedly held on the chuck table.

4. The method according to claim 2, prior to sucking and holding the board on the chuck table, the step of cutting and separating the board into large divisions.

5. The method according to claim 2, further comprising prior to the step of cutting and separating the board, the step of tentatively holding the board on the chuck table to be cut and separated into large divisions.

6. The method according to any one of claims 1 to 5, wherein the step of cutting and separating the board into large divisions is effected so incompletely that the divided board may be contiguous by the remaining board thickness between adjacent divisions.

\* \* \* \* \*